United States Patent [19]

Negishi et al.

[11] 4,215,387

[45] Jul. 29, 1980

[54] MULTI-LAYER FLEXIBLE PRINTED CIRCUIT BOARD ASSEMBLY

[75] Inventors: Kiyoshi Negishi, Asaka; Katsuhiko Miyata, Omiya, both of Japan

[73] Assignee: Asahi Kogaku Kogyo Kabushiki Kaisha, Tokyo, Japan

[21] Appl. No.: 946,916

[22] Filed: Sep. 28, 1978

[30] Foreign Application Priority Data

Oct. 6, 1977 [JP] Japan .......................... 52-134538[U]

[51] Int. Cl.² .............................................. H02B 1/04
[52] U.S. Cl. .................................... 361/398; 361/400; 361/414
[58] Field of Search ...................... 174/68.5; 339/17 F, 339/17 M, 17 T; 361/398, 400, 401, 412, 414

[56] References Cited

U.S. PATENT DOCUMENTS

| | | | |
|---|---|---|---|
| 3,474,297 | 10/1969 | Bylander | 361/398 |
| 3,553,030 | 1/1971 | Lebrun | 361/401 |
| 4,099,038 | 7/1978 | Purdy | 361/398 |

OTHER PUBLICATIONS

IBM Tech. Discl. Bull., Preparing Molded Circuits, Radovsky, vol. 4 No. 3 Aug. 1961, p. 30.

Primary Examiner—Gerald P. Tolin
Attorney, Agent, or Firm—Sughrue, Rothwell, Mion, Zinn & Macpeak

[57] ABSTRACT

A multi-layer flexible printed circuit board assembly, having at least two flexible printed circuit boards with electrical conductive layers piled one on another. The conductive layers face in the same direction and a portion of the lower flexible printed circuit board is not covered with the upper flexible printed circuit board. Hence, some of the lead wires of an electronic component can be connected to the electrical conductive layer of the upper flexible printed circuit board, and the remaining lead wires can be connected to said electrical conductive layer of the lower flexible printed circuit board. The portion of the lower flexible printed circuit board which is not covered by the upper flexible printed circuit board is raised so that the surface of a copper foil layer on the upper flexible printed circuit board is substantially flush with the surface of a copper foil layer on the lower flexible printed circuit board.

5 Claims, 4 Drawing Figures

MULTI-LAYER FLEXIBLE PRINTED CIRCUIT BOARD ASSEMBLY

BACKGROUND OF THE INVENTION

This invention relates to multi-layer flexible printed circuit board assemblies. The invention will be described with reference to an example where the assembly is effectively installed in a single-lens reflex camera.

Recently, electronic components have been extensively employed for use as exposure adjustment mechanism in single-lens reflex cameras. Instead of a CdS cell, an ammeter and variable resistor employed in a single-lens reflex camera with a through-the-lens (TTL) type exposure meter, electronic semiconductor components such as transistors have been extensively employed as a different type of exposure system. Accordingly, the circuit becomes rather intricate, and the number of components forming the circuit is increased. In view of workability and reliability, it is undesirable to connect the electronic components with lead wires. Also, the space considerations in such cameras limit the area available for such circuitry. In order to solve these problems, printed circuit boards have been proposed.

Circuit boards have been employed for wiring in a camera since the earliest single-lens reflex cameras, although the circuit itself it of simple construction. At that time, a hard printed circuit board called "a rigid printed circuit board" was used. Thereafter, the number of electronic components installed in a camera has steadily increased, and accordingly the space requirements dictate economies of use for a given small space in a camera body. Thus, flexible printed circuit boards which can be relatively freely installed in a camera have been employed.

Electronic components in a camera body, such as a light receiving element, a display element, a calculation element, and a control element are often coupled to the flexible printed circuit board. It has been the recent tendency for installation of electronic components in the camera, because the work efficiency and reliability are improved by using a flexible printed circuit board. However, as camera design becomes more complex and the number of functions performed has increased, the number of electronic components to be installed therein has accordingly increased and the wiring on the printed circuit board has become more intricate.

On the other hand, a requirement exists to reduce the weight and size of single-lens reflux cameras. In order to meet this requirement, recent camera bodies are smaller in size. However, this means that the space available for installing electronic components in the camera is reduced and accordingly it is now necessary to install a more intricate circuit in to a smaller space. Accordingly, the wiring on the printed circuit board is necessarily more complicated. However, it is obviously not desirable to lower the work efficiency and reliability of the camera, hence an important problem now exists to technically and simply install an intricate circuit in a limited space in the camera.

One of the flexible printed circuit boards used now is a flexible board having a copper foil on its one surface (hereinafter referred to as "a single-surface flexible board" when applicable). Since the single-surface flexible board has the copper foil on only one surface, the wiring is provided on only one surface of the flexible board. Therefore, the wiring cannot be done unless the flexible board is in planar form. Accordingly, sometimes it is necessary to achieve the wiring with lead wires or jumper wires. However, this is not desirable, because if the number of lead wires is increased, the work effeciency and reliability are lowered.

Furthermore, since the components are installed only on one surface of the printed circuit board with exception of the case where through-holes are formed therein for mounting discrete components, the use of that type of printed circuit board is not advantageous in the utilization of the limited space.

On the other hand, a flexible board with copper foil layer on its both surfaces (hereinafter referred to as "a double-surface flexible board" when applicable) is known, and is suitable for reducing the number of lead wires. However, this type of flexible board is still disadvantageous in that through-holes must be formed therein for wiring. In order to positively achieve the through-hole plating, the diameter of the through-hole should be approximately 0.8 mm and the diameter of the land should be approximately 12 mm; that is, the through-holes occupy a relatively large space on the double-surface flexible board. Accordingly, the formation of the through-holes in the flexible board is to a certain extent necessarily limited. As the circuit becomes more intricate, the number of conductors is increased, and therefore, sometimes it is impossible to form the through-holes in the flexible board. For instance, a typical case is where adjacent ten pins of a small flat package type integrated circuit (IC) with about fifty pins spaced at pin intervals of 0.65 mm are extended through through-holes in the flexible board to the opposite surface thereof. If in this case the through-holes are aligned longitudinally at land intervals or 0.5 mm, then it is necessary to use a space 16.5×1.2 mm. This area is excessive when compared to the available space in a camera body. Thus, it is not practical to provide through-holes occupying such a large space of the printed circuit board which is to be installed in a small space in the camera body.

As is apparent from the above description, both the single-surface and double surface flexible boards still have disadvantages for use as an installed electronic circuit in a camera body.

Accordingly, an object of this invention is to provide an excellent printed circuit board in which two single-surface flexible boards are piled one on another in such a manner that their copper foil layers face in the same direction.

It is another object of this invention to eliminate the drawbacks accompanying the above-described single-surface and double-surface flexible boards.

Yet another object of this invention is to provide for a circuit board system useable in cameras that has high reliability yet does not require more than the limited space available in a modern camera body.

These and other objects of this invention are accomplished by means of using at least two flexible printed circuit boards with electrical conductive layers piled on top of each other. The conductive layers face in the some direction and a portion of the lower flexible printed circuit board is left uncovered. Hence the lead wires to some components can be coupled to the electrical conductive layer of the upper flexible printed circuit board. The remaining leads can be connected to the conductive layer on the lower flexible board.

Also, the portion of the lower flexible board not covered by the upper board is raised so that the copper foil layer on the upper board is substantially flush with the corresponding surface on the lower board.

This invention will now be described with reference to the drawings and the description of the preferred embodiment.

DESCRIPTION OF THE PREFERRED EMBODIMENT

Figure 1:
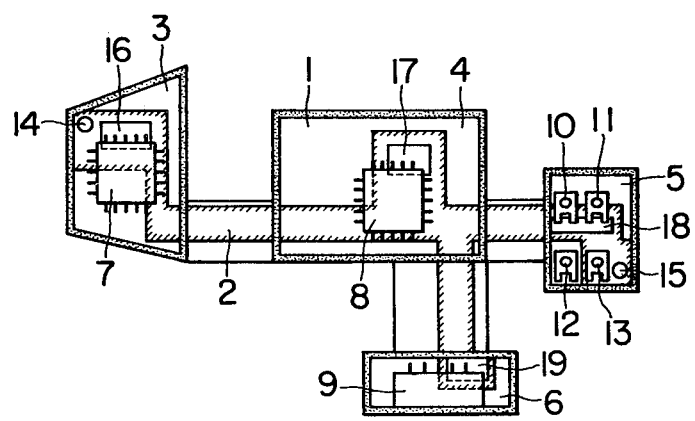
FIG. 1 is a plan view showing one example of a multi-layer printed circuit board assembly according to this invention.

One preferred embodiment of this invention will be described with reference to the accompanying drawings. Referring now to FIG. 1 it shows a plan view of a multi-layer printed circuit board assembly according to this invention. The assembly, as shown in FIG. 1, comprises an upper single-surface flexible board 1 whose configuration coincides with the configuration of all of lining reinforcement boards 3, 4, 5 and 6. A lower single-surface flexible board 2 is indicated by hatching lines. Slots or openings 16, 17, 18 and 19 are provided in the upper single-surface flexible board 1 to expose a copper foil on the lower single-surface flexible board therethrough, so that necessary components can be installed at those locations.

Some of the contact points of integrated circuits 7, 8 and 9 and semi-fixed resistors 10 and 11 are connected to the lower single-surface flexible board 2 independently of the wiring on the upper single-surface flexible board 1. Semi-fixed resistors 12 and 13 are connected to the upper single-surface flexible board 1. Before piling the two flexible boards one on another, it is necessary to align them with each other with high accuracy. For this purpose, guide holes 14 and 15 are provided in both of the flexible boards.

Figure 2:
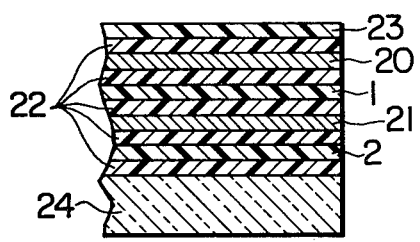
FIG. 2 is a sectional view illustrating a multi-layer printed circuit board assembly which is formed by piling two single-surface flexible boards one on another.

FIG. 2 is a sectional view of the multi-layer printed circuit board assembly. In FIG. 2, reference numerals 1 and 2 designate the upper and lower single-surface flexible boards as described above and reference numeral 20, a copper foil layer on the upper single-surface flexible board 1. A copper foil layer 21 is on the lower single-surface flexible board 2. The structure is topped by a cover film layer 23 and the foil layers are held in place by adhesive layers 22. Thus, an important feature of this invention resides in having one printed circuit board assembly formed by piling two flexible boards one on another.

The merits of the printed circuit board assembly thus constructed are as follows:

1. The amount of wiring can be doubled in a given space;

2. The copper foil on the lower single-surface flexible board is exposed through slots 16, 17, 18 and 19 formed in the upper single-surface flexible board, and therefore necessary components can be installed thereon by soldering or the like. In the embodiment shown in FIG. 1, some of the pins of the IC's 7, 8 and 9 and the two semi-fixed resistors 10 and 11 can be connected to the lower single-surface flexible board independently of the wiring on the upper single-surface flexible board 1;

3. The upper and lower single-surface flexible boards can be wired separately, and therefore components can be connected if needed with jumper wires;

4. For a portion of the lower single-surface flexible board on which the upper flexible board is placed, the upper single-surface flexible board serves as the cover film layer. Therefore, the cover film layer of the lower single-surface flexible board for that portion may be eliminated;

5. The wiring of the upper single-surface flexible board is completely independent of the wiring of the lower single-surface flexible board. Therefore, if a portion of the upper single-surface flexible board is extended, it can be connected to other electronic components such as light receiving elements and magnets. This can be applied also to the lower single-surface flexible board. Thus, the upper and lower single-surface flexible boards can be freely wired as individual or separate printed circuit boards;

6. For example, in connecting adjacent ten pins of a small flat package type integrated circuit having about fifty pins at a pin pitch of 0.65 mm to components remote from the integrated circuit without intersecting other wiring if a portion of the upper single-surface flexible board corresponding to the ten pins is removed therefrom, conductors connected to the components are arranged on the lower single-surface flexible board below that portion thus removed. The pins of the integrated circuit are connected thereto and the wiring of the components can be achieved independently of the other wiring. This is similar in use to the above-described through-hole technique of using a flexible board having copper foils on its both surfaces. However, in the through-hole method, a space 16.5×1.2 mm is necessary. On the other hand, with this invention the wiring can be achieved merely by removing a portion of the upper single-surface flexible board, and therefore the space required is only 6.5×2 mm. Thus, the present invention is markedly advantageous in the use of space when compared with the prior art through-hole method.

Thus, according to this concept, a given space can be more effectively utilized, and the degree of freedom in wiring is increased. The effects of the invention in which one printed circuit board assembly is formed with two single-surface flexible boards each having a copper foil on its one surface, are therefore highly significant.

In addition, in order to improve the alignment accuracy of the two single-surface flexible boards when stacking them one on another, the guide holes are formed in the two single-surface flexible boards, as described above. The provision of such guide holes is undoubtedly effective for the alignment of the two flexible boards.

Figure 3:
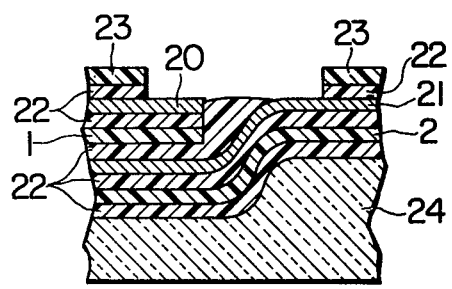
FIG. 3 is also a sectional view showing a multi-layer printed circuit board assembly where a part of the upper single-surface flexible board is omitted, while the lower single-surface flexible board is raised.

If, in connecting components between the upper and lower single-surface flexible boards as set forth in item 2 above, the following method is employed, the components can be effectively installed on the flexible boards. When the upper single-surface flexible board 1, the lower single-surface flexible board 2, the lining reinforcement board 24, and the cover film layer 23 are bonded together according to a thermal compressive adhesion method or the like, a hard mat on the lining reinforcement board side is subjected to thermal compressive adhesion. A portion of the lower single-surface flexible board below the removed portion of the upper single-surface flexible board is raised by the pressure applied to the portions of the upper and lower single-surface flexible boards where they are piled one on another, so that the surface of the copper foil on the upper single-surface flexible board is flush with the surface of the copper foil on the lower single-surface flexible board. An example of a multi-layer printed circuit board assembly formed according to this technique is shown in FIG. 3.

Figure 4:
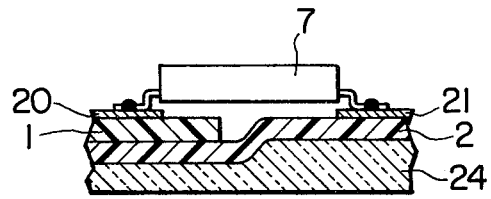
FIG. 4 is a sectional view showing the assembly in FIG. 3 on which a component (IC) is installed.

FIG. 4 is a schematic sectional view of the multi-layer printed circuit board assembly on which a component 7 is installed. As shown, the foil layers 20 and 21 are coplanar so the component 7 is parallel to the board face. Hence, the overall thickness of the board assembly remains the same.

The invention has been described with reference to the case where the multi-layer printed circuit board assembly is installed in the single-lens reflex camera; however, it should be understood that the invention is not limited thereto or thereby. That is, the technical concept of this invention can be effectively applied to installation of a circuit in electronic equipment. Furthermore, the multi-layer printed circuit board assembly described above is formed by piling two flexible boards one on another; however, such a multi-layer printed circuit board assembly can be made up of more than two flexible boards with the same effects.

We claim:

1. A multi-layer flexible printed circuit board assembly comprising: at least two substantially flat flexible printed circuit boards, each of said circuit boards having an electrically conductive layer secured to the top surface thereof; said boards being stacked on top of each other with the conductive layers aligned with each other and facing in the same direction; a portion of the upper board in the stack having an opening therein uncovering a portion of the lower board; the uncovered portion of the lower board being bent upwardly into said opening so that the conductive layers on the upper board and uncovered portion of the lower board are co-planar; and an electrical component having two leads, one of which is connected to the conductive layer on the upper board, and the other of which is connected to the conductive layer on the lower board so that the plane of the connected electrical component is parallel to the plane of the co-planar conductive layers.

2. The assembly of claim 1 further comprising a reinforcement board fixed to the lower surface of the substrate of the lower board including the bent portion thereof.

3. The assembly of claim 1 wherein each of said printed circuit boards comprises a flexible substrate, an adhesive layer and a sheet of copper foil attached to said substrate by said adhesive layer.

4. The assembly of claim 3 wherein said upper board has a cover film layer attached to its conductive copper foil sheet.

5. The assembly of claim 3 wherein said uncovered portion of lower board has a cover film layer attached to its conductive copper foil sheet.

* * * * *